United States Patent [19]
Yamada et al.

[11] Patent Number: 5,488,636
[45] Date of Patent: Jan. 30, 1996

[54] DIGITAL DATA DETECTOR

[75] Inventors: Eiji Yamada, Tenri; Hitoshi Takeuchi, Kitakatsuragi, both of Japan

[73] Assignee: Sharp Kabushiki Kaisha, Osaka, Japan

[21] Appl. No.: 266,755

[22] Filed: Jun. 28, 1994

[30] Foreign Application Priority Data

Jun. 30, 1993 [JP] Japan .................... 5-162032

[51] Int. Cl.$^6$ .................................... H03D 1/00
[52] U.S. Cl. .................... 375/340; 375/371; 341/122; 327/91
[58] Field of Search ................ 375/94, 118, 119, 375/120; 341/122; 307/352, 353

[56] References Cited

U.S. PATENT DOCUMENTS

| | | | |
|---|---|---|---|
| 4,792,964 | 12/1988 | Yoshida | 375/118 |
| 4,910,517 | 3/1990 | Takeuchi et al. | 341/122 |
| 5,355,392 | 10/1994 | Takeuchi et al. | 375/94 |

FOREIGN PATENT DOCUMENTS 5-51982  5/1984  Japan .

*Primary Examiner*—Stephen Chin
*Assistant Examiner*—Bryan Webster
*Attorney, Agent, or Firm*—Nixon & Vanderhye

[57] ABSTRACT

A digital data detector samples a signal at twice the data rate and calculates a phase interval from a zero crossing point to the current sampling point. The phase of the current sampling point is predicted based on the phase of a sampling point located before the current sampling point, the phase of a sampling point located at least two points before the current sampling point, and a zero crossing detection signal. A predicted error is calculated between a calculated phase interval and a predicted current phase. The frequency band of the predicted error is limited, and the phase of the current sampling point is calculated according to the band-limited predicted error, the predicted current phase, and the zero crossing detection signal. A data detection clock is detected in synchronization with a received digital data according to the calculated phase of each sampling point. A digital data value is detected using the phase interval, the calculated current phase, and sampling data. The predicted error is band-limited, and the phase of the current sampling point is calculated to follow only fluctuation due to wow and flutter in a relatively low frequency band. Since a clock signal is detected for data detection according to the calculated phase, digital data can be detected with a small data error rate even from received digital data having a low signal to noise ratio.

12 Claims, 4 Drawing Sheets

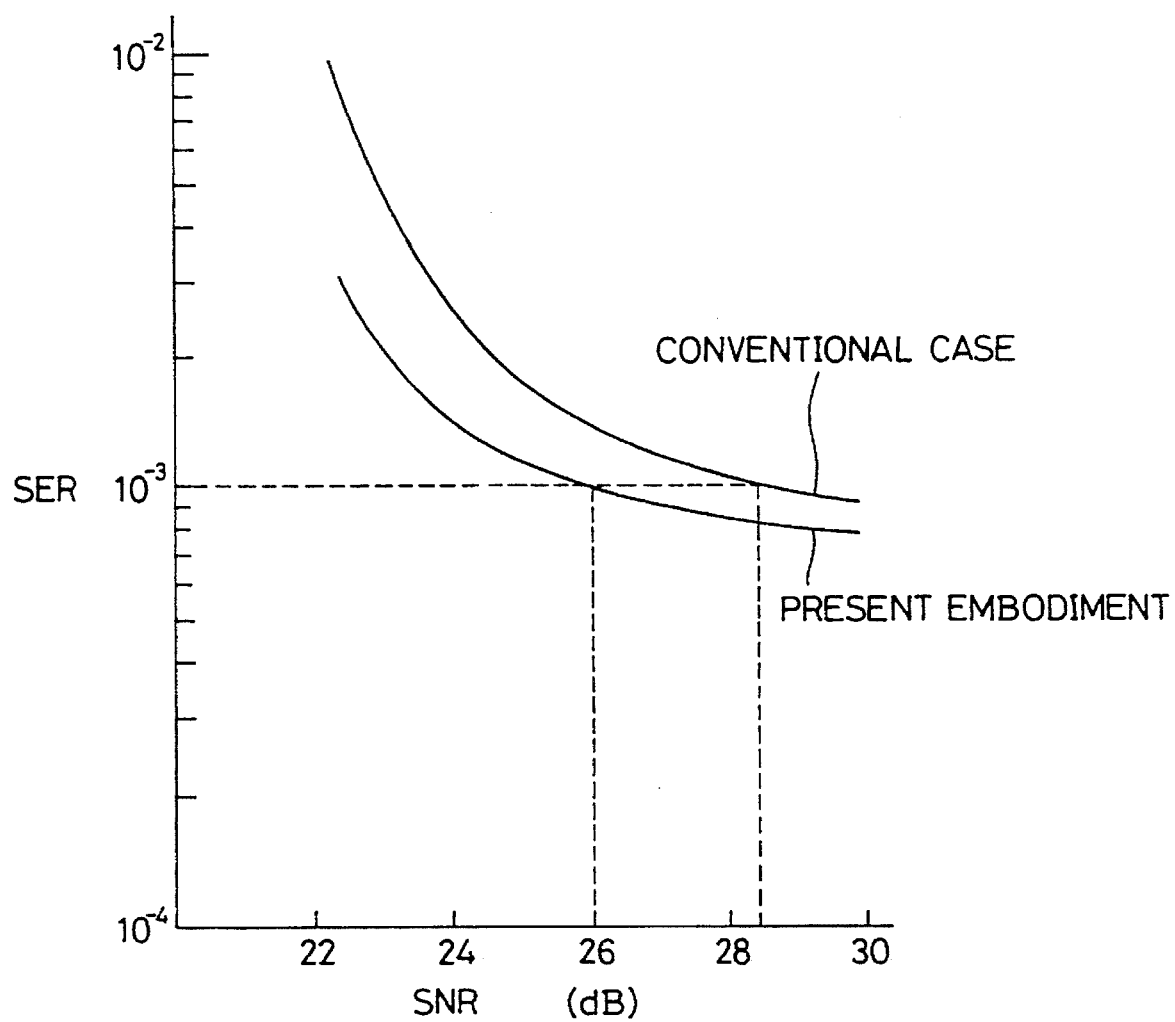

DIGITAL DATA DETECTOR

BACKGROUND OF THE INVENTION

This application is related to U.S. patent application Ser. No. 07/986,490 commonly assigned to the assignee of the present application.

1. Field of the Invention

The present invention relates to digital data detectors, and more particularly to a digital data detector for detecting a data detection clock signal and digital data from a received digital signal in a digital data transmission system.

2. Description of the Related Art

There are various methods of detecting digital data from a received digital signal. One example is disclosed in the digital data detection apparatus of the aforementioned U.S. patent application Ser. No. 07/986,490. This apparatus detects digital data from a received digital signal as set forth in the following. In the following description, a "zero crossing point" refers to the point where a received signal crosses the zero level, and a "current sampling point" refers to a sampling point where the current phase is to be calculated. The current sampling point is represented by $R_{i+1}$, the sampling point which is located one point before the current sampling point is represented by $R_i$ (referred to as the preceding sampling point hereinafter), the sampling point which is located two points before the current sampling point is represented by $R_{i-1}$ (referred to as the second preceding sampling point hereinafter), and so on. The phase of sampling point $R_i$ is $P_i$, and the amplitude value of the sampled data is $S_i$.

First, a digital received signal is sampled at a frequency of m times (m>1) a channel bit rate. It is assumed that a digital received signal is sampled at a frequency of two times the channel bit rate in the present specification (i.e., m=2).

The phase interval P between the zero crossing point of a received signal and the current sampling point $R_{i+1}$ is obtained by the following equation (1) according to sampling data $S_{i+1}$ of the current sampling point $R_{i+1}$ and sampling data $S_i$ of the preceding sampling point $R_i$. The phase of each sampling point is represented by the values of 0–N–1 obtained by equally dividing the channel bit interval by N. Therefore, in equation (1), N represents the channel bit interval, and N/2 represents half the channel bit interval.

$$P=|S_{i+1}|/(|S_{i+1}|+|S_i|) \times (N/2) \qquad (1)$$

Since the phase of a sampling point returns to 0 at the head of each channel bit interval, the calculation of a phase is carried out in modulo N (mod N) hereinafter.

If the phase of the zero crossing point is selected as a reference, and if it is supposed to be zero, the phase interval P yielded by equation (1) represents the instantaneous phase of the current sampling point $R_{i+1}$ (referred to as the current instantaneous phase hereinafter).

Then, determination is made whether there is a zero crossing point immediately before the preceding sampling point $R_i$. More specifically, determination is made whether there is a zero crossing point between the preceding sampling point $R_i$ and the second preceding sampling point $R_{i-1}$.

If a zero crossing point is present, a predicted value $Pd_{i+1}$ of the phase interval between sampling points $R_{i+1}$ and $R_i$ is obtained by the following equation (2) using a phase $P_i$ of a sampling point $R_i$ (referred to as the preceding phase hereinafter) and a phase $P_{i-j}$ (referred to as at least the second preceding phase hereinafter) of a sampling point $R_{i-j}$ (j≥2) which is located at least two points before the current sampling point $R_{i+1}$.

$$Pd_{i+1}=\{(P_i-P_{i-j}-((N/2\times j) \bmod N))\times L+N/2\} \bmod N \qquad (2)$$

where "mod" is a remainder operator. More specifically, the calculated result of "x mod y" is the remainder of x divided by y. L is a constant number where 0<L<1.

When there is no zero crossing point, the predicted value $Pd_{i+1}$ of the phase interval between the current sampling point $R_{i+1}$ and the preceding sampling point $R_i$ is made equal to a predicted value $Pd_i$ of the phase interval between the preceding sampling point $R_i$ and the second preceding sampling point $R_{i-1}$ as shown in the following equation (3).

$$Pd_{i+1}=P_i \qquad (3)$$

A predicted value $P_{i+1}'$ of the current phase is obtained by the following equation (4) using the predicted value $Pd_{i+1}$ of the phase interval obtained from equation (2) or (3) and the preceding phase $P_i$.

$$P_{i+1}'=(P_i+Pd_{i+1}) \bmod N \qquad (4)$$

When there is a zero crossing point immediately before preceding the current sampling point $R_{i+1}$, i.e., when there is a zero crossing point between sampling points $R_{i+1}$ and $R_i$, the current phase $P_{i+1}$ is obtained by the following equation (5) using the predicted value $P_{i+1}'$ of the current phase obtained by equation (4) and the aforementioned current instantaneous phase P.

$$P_{i+1}=\{(P-P_{i+1}')\times K+P_{i+1}'\} \bmod N \qquad (5)$$

where K is a constant corresponding to a loop gain (0<K<1).

When a zero crossing point is not present immediately before preceding the current sampling point $R_{i+1}$, the current phase is made equal to the predicted value $P_{i+1}'$ of the current phase, as shown in the following equation (6).

$$P_{i+1}=P_{i+1}' \qquad (6)$$

A data detection clock signal and digital data are detected according to the current phase $P_{i+1}$, the preceding phase $P_i$, conditions of clock signal extraction and data determination, and the current instantaneous phase thus obtained, i.e. the phase interval P between the zero crossing point and the current sampling point $R_{i+1}$. The clock signal extraction conditions are shown in equations (7)–(9).

$$P_i>P_{i+1} \text{ and } P_i \geq N/2 \text{ and } P_{i+1} \geq N/2 \qquad (7)$$

$$P_i>P_{i+1} \text{ and } P_i<N/2 \text{ and } P_{i+1}<N/2 \qquad (8)$$

$$P_i<P_{i+1} \text{ and } P_i<N/2 \text{ and } P_{i+1} \geq N/2 \qquad (9)$$

Determination is made that a clock signal is present when the phase interval P between the zero crossing point and the current sampling point $R_{i+1}$, the current phase $P_{i+1}$, and the preceding phase $P_i$ satisfy at least one of the clock signal extraction conditions of equations (7)–(9).

The data determination condition is shown in the following equation (10).

$$P>P_{i+1}-N/2 \qquad (10)$$

If equation (10) is met, the value of the digital data is the opposite of the MSB of sampling data Si, otherwise the MSB of Si.

The reason why the instantaneous phase P fluctuates due to noise and a wow and flutter in a received digital signal will be described hereinafter.

Referring to FIG. 1, the error ε between a correct instantaneous phase Pt and an instantaneous phase P calculated according to equation (1) is small when there is no noise and wow/flutter in a received digital signal. More specifically, the error ε is small between the phase interval between the point where the received digital signal crosses the reference level and the current sampling point $R_{i+1}$, and the instantaneous phase P.

Referring to FIG. 2, the correct instantaneous phase Pt per se varies according to the fluctuation of a received digital signal itself when there is a wow and flutter in the received digital signal. Since instantaneous phase P calculated according to equation (1) follows this change, the error ε of the instantaneous phase P with respect to a correct instantaneous phase Pt is similarly small as in FIG. 1.

Referring to FIG. 3, instantaneous phase P fluctuates due to noise in a received digital signal although there is no fluctuation of the received digital signal per se. Therefore, the error ε between a correct instantaneous phase Pt and an instantaneous phase P calculated by equation (1) is large.

Mapping the fluctuation of an instantaneous phase P due to noise and wow/flutter into a frequency domain, fluctuation due to wow and flutter resides in a relatively low frequency range. In contrast, fluctuation due to noise is apt to increase as the frequency range becomes higher. It is desired that a digital data detector for detecting digital data from a received digital signal including noise and wow flutter obtains a clock signal that follows only the frequency band of fluctuation due to wow and flutter, and not the frequency band due to noise or the like.

The digital data detector disclosed in U.S. patent application Ser. No. 07/986,490 corresponds to a digital data reception signal with the above-described wow and flutter. However, there are still the following problems to be solved.

In recent years, there has been intensive efforts to reduce the size and cost of, for example, a magnetic tape recording/reproducing apparatus. In consequence, the signal to noise ratio (referred to as SNR hereinafter) of a received digital signal reproduced from a magnetic tape is degraded.

Reduction in SNR increases the possibility of an error in the detected digital data, resulting in decrease of the reliability of the system. This problem is encountered even in the digital data detector of the aforementioned U.S. patent application Ser. No. 07/986,490.

SUMMARY OF THE INVENTION

In view of the foregoing, an object of the present invention is to provide a digital data detector that can detect digital data with a small data error even from a received digital signal having a low SNR.

Another object of the present invention is to provide a digital data detector that can detect digital data with a small data error even from a received digital signal having a low SNR by obtaining a clock signal that closely follows fluctuation caused by wow and flutter out of fluctuations of an instantaneous phase of a received digital signal.

A further object of the present invention is to provide a digital data detector that can detect digital data with a small data error even from a received digital signal having a low SNR by obtaining a clock signal that closely follows fluctuation in a relatively low frequency band caused by wow and flutter out of fluctuations of an instantaneous phase of a received digital signal.

A digital data detector according to the present invention includes: a sampling circuit for sampling a received digital signal at a constant frequency higher than that of a channel bit rate; a phase interval calculation circuit for calculating a phase interval from a point where the received digital signal crosses a reference level to the current sampling point according to an output of the sampling circuit; a reference level cross detection circuit for detecting crossing of the reference level by the received digital signal between the current sampling point and a sampling point located one point before the current sampling point to provide a cross detection signal; a current phase prediction circuit for calculating a predicted phase of the current sampling point according to the phase of a sampling point located one point before the current sampling point, the phase of a sampling point located at least two points before the current sampling point, and a cross detection signal; a prediction error calculation circuit for calculating a predicted error between the phase interval calculated by the phase interval calculation circuit and the predicated current phase; a band limiting circuit for limiting the frequency band of the predicted error according to the cross detection signal; a phase calculation circuit for calculating the phase of the current sampling point according to the band-limited predicted error, the predicted current phase, and the cross detection signal; a data detection clock detection circuit for detecting a data detection clock in synchronization with the received digital signal according to the phase of each sampling point calculated by the phase calculation circuit; and a data detection circuit for detecting digital data from the received digital signal according to the phase interval calculated by the phase interval calculation circuit, the current phase calculated by the phase calculation circuit, and the sampling data detected by the sampling circuit.

The band limiting circuit preferably includes a digital filter circuit. The digital filter circuit preferably includes an FIR filter circuit or an IIR filter circuit.

In the above-described digital data detector of the present invention, a phase interval from the point where the received digital data crosses the reference level to the current sampling point is calculated according to sampling data. A cross detection signal is output indicating whether the received digital signal crosses the reference level between the current sampling point and a sampling point located one point before the current sampling point. A predicted phase of the current sampling point is calculated according to the phase of the sampling point located one point before the current sampling point, the phase of the sampling point located at least two points before the current sampling point, and the cross detection signal. A predicted error is calculated between the calculated phase interval and the predicted current phase. The band limiting circuit limits the frequency band of the predicted error according to the cross detection signal. The phase of the current sampling point is calculated according to the band-limited predicted error, the predicted current phase, and the phase detection signal. The predicted error is band-limited, and the phase of the current sampling point is calculated to follow only the fluctuation due to wow and flutter in the relatively low frequency band. Because a clock signal for data detection is detected according to the calculated phase, digital data can be detected with a low data error even from a received digital signal of a low SNR.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows measured values of a symbol error rate (referred to as SER hereinafter) per 1 symbol of digital data detected from a magnetic recording/reproducing apparatus with respect to a SNR.

DESCRIPTION OF THE PREFERRED EMBODIMENTS

Figure 1:
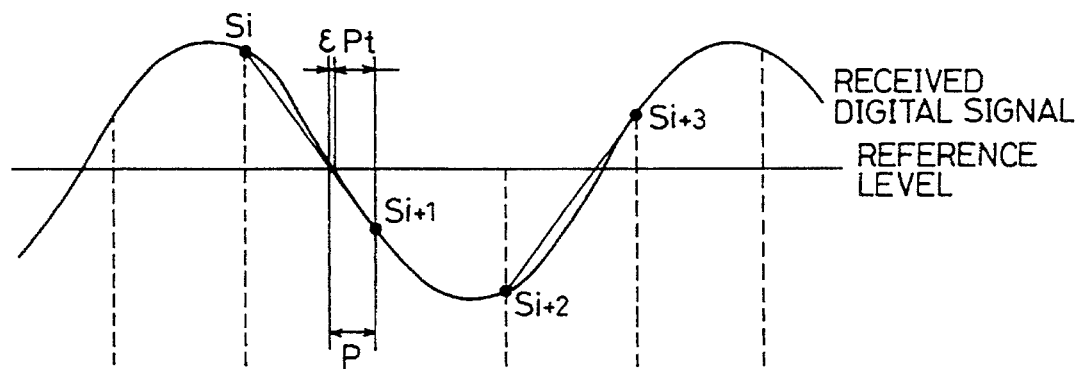
FIGS. 1–3 schematically show fluctuation of an instantaneous phase P due to noise and wow flutter in a received digital signal.
Figure 2:
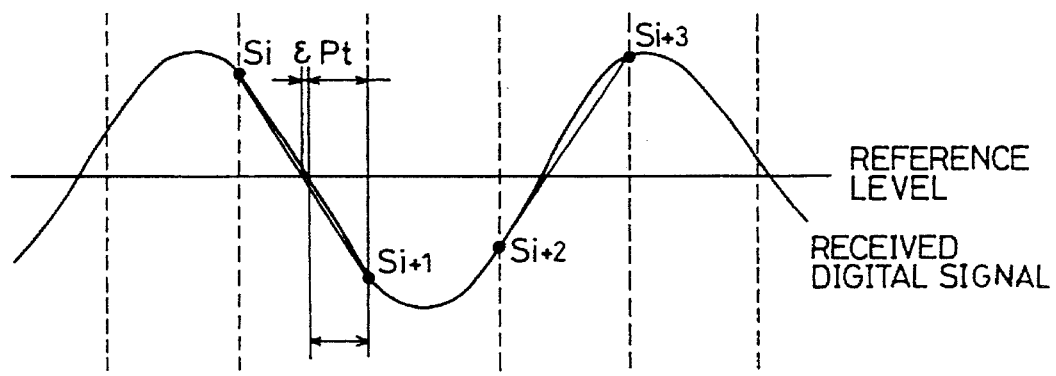
Figure 3:
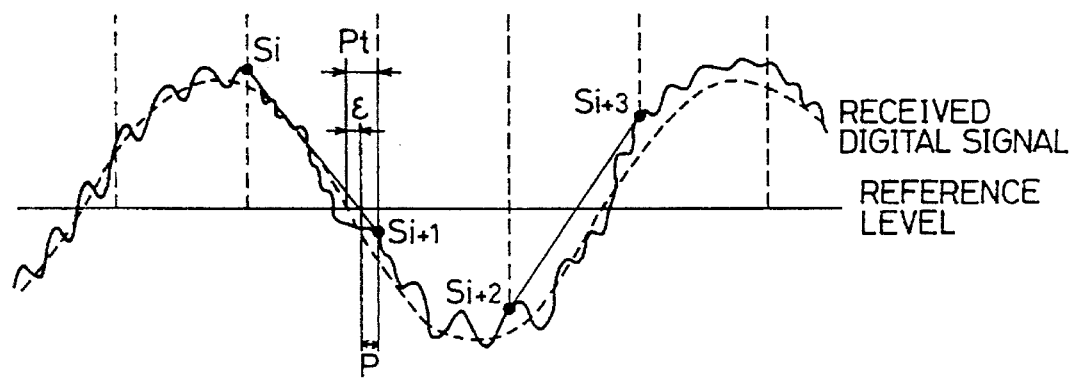
Figure 4:
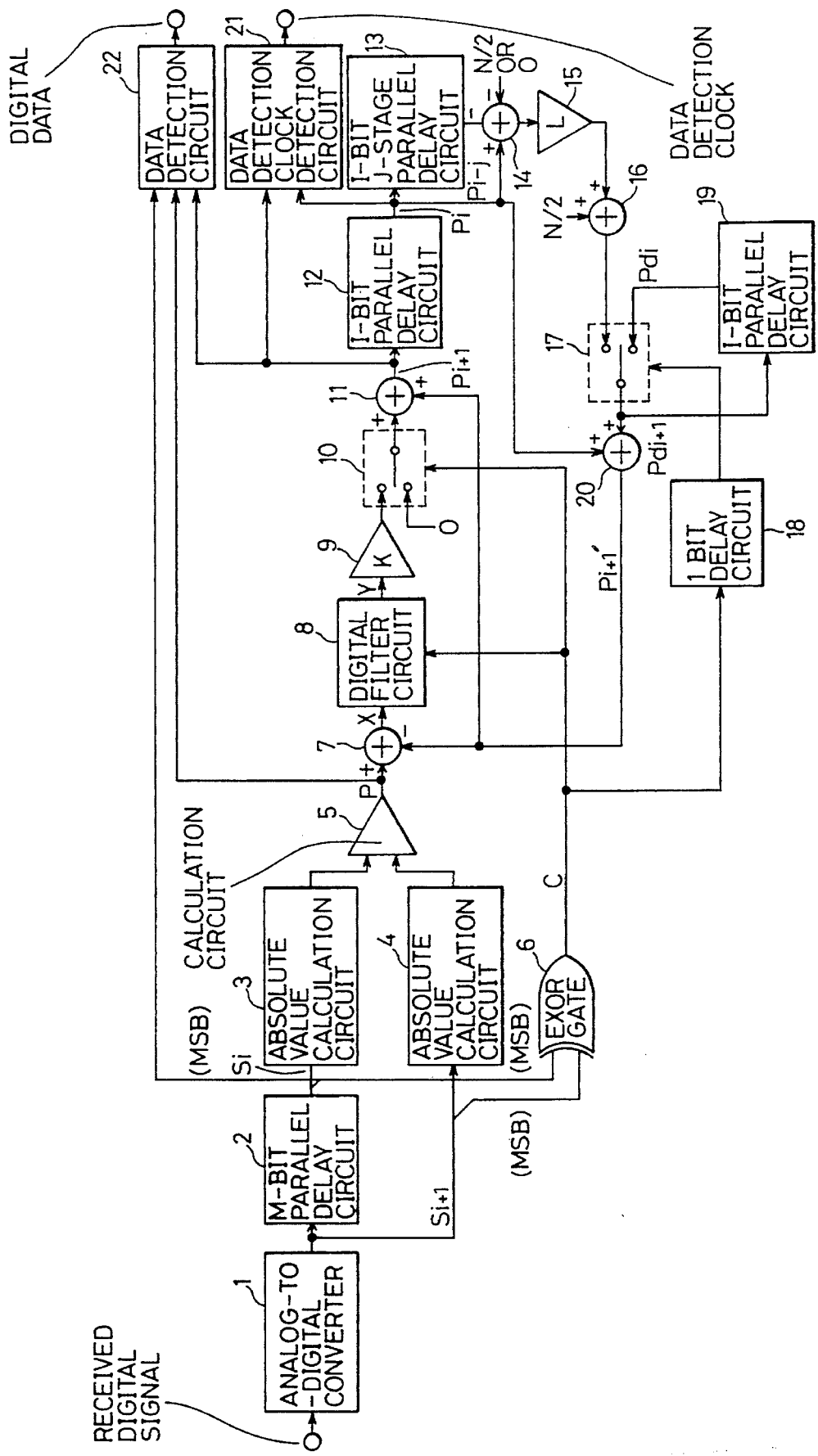
FIG. 4 is a block diagram of a digital data detector according to an embodiment of the present invention.

Referring to FIG. 4, a digital data detector according to an embodiment of the present invention detects digital data by sampling a received digital signal at a frequency of m times (m>1) a channel bit rate. In the following description, it is assumed that m=2. However, m is not limited to 2 in the present invention.

Referring to FIG. 4, a received digital signal is applied to an analog-to-digital converter 1 of the digital data detector according to an embodiment of the present invention. Analog-to-digital converter 1 samples the received digital signal at a frequency of two times the bit channel rate, and converts the same into digital data of M bits. In this conversion, the polarity of the received digital signal is represented by "0" and "1" of the MSB (Most Significant Bit) of the digital data converted into M bits using a 2's complement, for example.

The output of analog-to-digital converter 1 represents the current sampling data $S_{i+1}$, which is applied to an absolute value calculation circuit 4 and an M-bit parallel delay circuit 2. Because M-bit parallel delay circuit 2 has a delay corresponding to a sampling period, the output thereof is sampling data Si of the preceding sampling point, which is provided to an absolute value calculation circuit 3.

The outputs of absolute value calculation circuits 3 and 4 are the preceding and the current sampling data $S_i$ and $S_{i+1}$ converted into absolute values $|S_i|$ and $|S_{i+1}|$, which are both provided to a calculation circuit 5. Calculation circuit 5 obtains the phase interval between the zero crossing point and the current sampling point $R_{i+1}$ according to equation (1) using the provided absolute values of $|S_i|$ and $|S_{i+1}|$. In other words, calculation circuit 5 provides the current instantaneous phase P.

Determination is made as to presence/absence of a zero crossing point between the current sampling point $R_{i+1}$ and the preceding sampling point $R_i$ as set forth in the following. The MSBs of the outputs of analog-to-digital converter 1 and M-bit parallel delay circuit 2 are applied to the two inputs of an exclusive-OR gate (referred to as EXOR gate hereinafter) 6. EXOR gate 6 provides a zero crossing point signal C which assumes "1" when the logical values of the two inputs differ, and "0" when the logical values of the two inputs are identical. The polarity of a sampling data is represented by the MSB indicating "1" or "0", as described before. There is a zero crossing point between the current sampling point $R_{i+1}$ and the preceding sampling point $R_i$ when the zero crossing point signal C output from EXOR gate 6 is "1". Therefore, the current instantaneous phase P output from calculation circuit 5 is valid only when zero crossing point signal C from EXOR gate 6 is "1".

The output of calculation circuit 5 representing the current instantaneous phase P is provided to a subtraction circuit 7. The output of an adder circuit 20 representing a predicted value $P_{i+1}'$ of the current phase which will be described afterwards is also applied to subtraction circuit 7. In subtraction circuit 7, the predicted value $P_{i+1}'$ of the current phase is subtracted from the current instantaneous phase P, which is a predicted error X of the current phase. The predicted error X is provided to a digital filter circuit 8.

In addition to a predicted error X of the current phase, a zero crossing point signal C from EXOR gate 6 is applied to digital filter circuit 8. The output of digital filter circuit 8 is a band-limited predicted error Y of the current phase. The band-limited predicted error Y of the current phase is obtained by blocking the frequency band of the fluctuation due to noise and passing only the frequency band of the fluctuation due to wow and flutter from the predicted error X of the current phase. The method of obtaining band-limited predicted error Y will be described in detail afterwards. The band-limited predicted error Y of the current phase is applied to a coefficient circuit 9.

Coefficient circuit 9 multiplies the band-limited predicted error Y of the current phase by a coefficient K (0<K<1) corresponding to a loop gain for correction thereof. The result is applied to one input of a selection circuit 10.

A constant "0" is applied to the other input of selection circuit 10. A zero crossing point signal C which is an output of EXOR gate 6 is applied to the control terminal of selection circuit 10. As described before, the current instantaneous phase P is valid only when zero crossing point signal C is "1". Selection circuit 10 selects and provides the output of coefficient circuit 9 when zero crossing point signal C is "1". Otherwise, selection circuit 10 selects "0". The output of selection circuit 10 is provided to an adder circuit 11.

An output of adder circuit 20 representing a predicted value $P_{i+1}'$ of the current phase which will be described afterwards is applied to the other input of adder circuit 11. Adder circuit 11 adds the two values and outputs the current phase $P_{i+1}$. The current phase $P_{i+1}$ is represented by equation (5) if there is a zero crossing point between the preceding sampling point and the current sampling point, otherwise represented by equation (6).

The output of adder circuit 11 representing the current phase $P_{i+1}$ is applied to an I-bit parallel delay circuit 12. Since I-bit parallel delay circuit 12 has a delay corresponding to the sampling period, the output thereof is the preceding phase $P_i$, which is applied to an I-bit j-stage parallel delay circuit 13 and a subtraction circuit 14.

I-bit j-stage parallel delay circuit 13 has a delay which is j times (j is a natural number) the sampling period. The output is a phase $P_{i-j}$ of j+1 points before the current point, which is applied to subtraction circuit 14.

Subtraction circuit 14 subtracts the output of I-bit j-stage parallel delay circuit 13 from the output of I-bit parallel delay circuit 12 to obtain a phase $P_i-P_{i-j}$, which is further subtracted by an ideal phase interval of sampling points corresponding to the delay of I-bit j-stage parallel delay circuit 13. The ideal phase interval of sampling points is determined by the number of stages j of I-bit j-stage parallel delay circuit 13. More specifically, when j is an odd number, the phase internal is N/2, and when j is an even number, the phase internal is 0.

The output of subtraction circuit 14 is provided to coefficient circuit 15. Coefficient circuit 15 carries out a correction process by multiplying the output of subtraction circuit 14 by a coefficient L (0<L<1). The result is applied to an adder circuit 16.

Adder circuit 16 adds a phase value N/2 representing a sampling period to the output of coefficient circuit 15. The output of adder circuit 16 is applied to a selection circuit 17.

Additionally, the outputs of 1 bit delay circuit 18 and I-bit parallel delay circuit 19 are applied to selection circuit 17. 1 bit delay circuit 18 delays the zero crossing point signal C from EXOR gate 6 by a time period corresponding to the sampling period. In other words, the output of 1 bit delay circuit 18 indicates whether there is a zero crossing point between the preceding sampling point $R_i$ and the second preceding sampling $R_{i-1}$.

I-bit parallel delay circuit 19 delays the output of selection circuit 17 for a time period corresponding to the sampling period.

Selection circuit 17 selects the output of adder circuit 16 when the output of 1 bit delay circuit 18 is "1", otherwise selects the output of I-bit parallel delay circuit 19. More specifically, selection circuit 17 selects the output of adder circuit 16 when there is a zero crossing point between the preceding sampling point $R_i$ and the second preceding sampling point $R_{i-1}$, and selects the output of I-bit parallel delay circuit 19 when there is no zero crossing point therebetween. Selection circuit 17 outputs the selected value as a predicted value $Pd_{i+1}$ of the phase interval between the current sampling point $R_{i+1}$ and the preceding sampling point $R_i$. The predicted value $Pd_{i+1}$ is applied to an adder circuit 20 and I-bit parallel delay circuit 19.

Therefore, the output of I-bit parallel delay circuit 19 is a predicted value $Pd_i$ of the phase interval between the preceding sampling point $R_i$ and the second preceding sampling point $R_{i-1}$.

The output of I-bit parallel delay circuit 12 is applied to the other input of adder circuit 20. More specifically, a predicted value $Pd_{i+1}$ of the phase interval and the preceding phase $P_i$ is applied to adder circuit 20. Adder circuit 20 adds the two values to provide a predicted value $P_{i+1}'$ of the current phase.

It is to be noted that the preceding phase calculation is not merely an arithmetic calculation, but a modulo N operation. Similar to the calculation of an angle which is carried out in the range from 0 to 360 degrees, the calculation of a phase must be carried out between 0 to N.

On the basis of the above-described obtained phase information, a data detection clock signal and digital data are detected. Referring to FIG. 4, the output of adder circuit 11 representing the current phase $P_{i+1}$ and the output of I-bit parallel delay circuit 12 representing the preceding phase $P_i$ are applied to a clock signal detection circuit 21 for detecting a data detection clock signal. Clock signal detection circuit 21 compares the clock signal extraction conditions shown in equations (7)–(9) with the two inputs. If the conditions are met, i.e., if the digital data is valid, clock signal detection circuit 21 outputs a "1". If the conditions are not met, i.e., if the digital data is not valid, clock signal detection circuit 21 outputs a "0". Thus, clock signal detection circuit 21 provides a data detection clock signal. A circuit subsequent to the digital data detector, for example a demodulator circuit, processes only valid digital data according to this data detection clock signal.

A MSB which is the output of M-bit parallel delay circuit 2 representing the polarity of the preceding sampling data is applied to data detection circuit 22. Data detection circuit 22 also receives a current instantaneous phase P from calculation circuit 5, and a current phase $P_{i+1}$ from adder circuit 11. Data detection circuit 22 compares these inputs with the data determination condition shown in equation (10) to detect digital data according to the comparison result.

Figure 5:
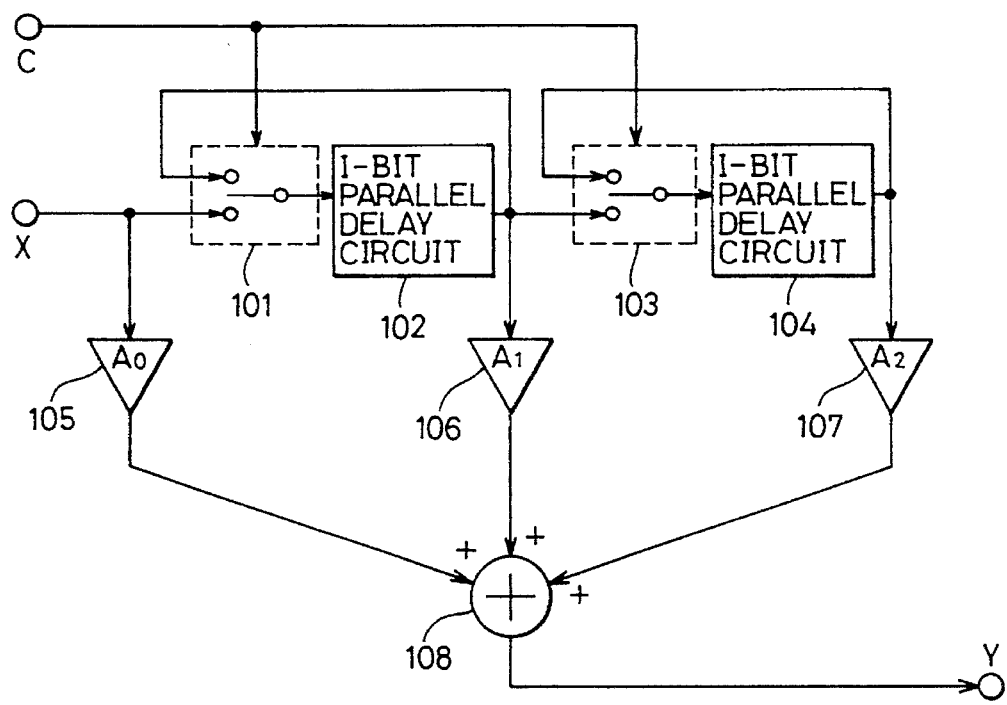
FIG. 5 is a block diagram specifically showing a digital filter circuit according to an embodiment of the present invention.

FIG. 5 is a block diagram specifically showing a structure of digital filter circuit 8 of FIG. 4.

Digital filter circuit 8 shown in FIG. 5 is termed a finite impulse response digital filter (referred to as FIR filter hereinafter). A z transfer function H(z) thereof is represented by the following equation (11).

$$H(z) = \sum_{i=0}^{\alpha} A_i z^{-1}$$

where $A_i$ (i=0, 1, 2, ...) is a filter coefficient, and $\alpha$ is a dimension of the FIR filter circuit. In this digital filter circuit, $z^{-1}$ represents the delay of time corresponding to a zero crossing point interval.

A specific example of the digital filter circuit of FIG. 5 is a 2-dimension FIR filter circuit. The z transfer function H(z) is represented by the following equation (12) by setting $\alpha=2$ in equation (11).

$$H(z) = A_0 + A_1 z^{-1} + A_2 z^{-2} \quad (12)$$

The predicted error X of the current phase provided from subtraction circuit 7 shown in FIG. 4 to the FIR filter circuit is applied to one input of a selection circuit 101 and the input of a coefficient circuit 105 of FIG. 5.

The output of a I-bit parallel delay circuit 102 representing a predicted error $X_{-1}$ (=$Xz^{-1}$) of the preceding phase which will be described afterwards is applied to the other input of selection circuit 101. A zero crossing point signal C is applied to the control signal input of selection circuit 101. Selection circuit 101 selects a predicted error X of the current phase when zero crossing point signal C is "1", otherwise a predicted error $X_{-1}$ of the preceding phase. The output of selection circuit 101 is provided to I-bit parallel delay circuit 102.

Since I-bit parallel delay circuit 102 has a delay corresponding to the sampling period, the output thereof is a predicted error $X_{-1}$ of the preceding phase. The predicted error $X_{-1}$ of the preceding phase is held by selection circuit 101 and I-bit parallel delay circuit 102, which is updated when the zero crossing point signal C is "1". More specifically, the held predicted error $X_{-1}$ of the preceding phase is updated when there is a zero crossing point between the current sampling point $R_{i+1}$ and the preceding sampling point $R_i$. The output of I-bit parallel delay circuit 102 representing a predicted error $X_{-1}$ of the preceding phase is, as described above, provided to the other input of selection circuit 101, and also to one input of selection circuit 103 and the input of coefficient circuit 106.

The output of I-bit parallel delay circuit 104 representing a predicted error $X_{-2}$ (=$Xz^{-2}$) of the second preceding phase, which will be described afterwards, is applied to the other input of selection circuit 103. A zero crossing point signal C is applied to the control input of selection circuit 103. Selection circuit 103 selects the predicted error $X_{-1}$ of the preceding phase when the zero crossing point signal C is "1", otherwise selects prediction error $X_{-2}$ of the second preceding phase. The output of selection circuit 103 is applied to I-bit parallel delay circuit 104.

I-bit parallel delay circuit 104 has a delay corresponding to the sampling period, and provides a predicted error $X_{-2}$ of the second preceding phase. The predicted error $X_2$ of the second preceding phase is held by selection circuit 103 and I-bit parallel delay circuit 104, which is updated when the zero crossing point signal C is "1". More specifically, the predicted error $X_{-2}$ of the second preceding phase is updated when there is a zero crossing point between the current sampling point $R_{i+1}$ and the preceding sampling point $R_i$. The output of I-bit parallel delay circuit 104 representing a predicted error $X_{-2}$ of the second preceding phase is, as described above, applied to one input of selection circuit 103, and also to the input of coefficient circuit 107.

Coefficient circuits 105, 106, and 107 multiply the predicted error X of the current phase, the predicted error $X_{-1}$ of the preceding phase, and the predicted error $X_{-2}$ of the second preceding phase by filter coefficients $A_0$, $A_1$, and $A_2$, respectively. The results are applied to an adder circuit 108.

Adder circuit 108 adds all the outputs of coefficient circuits 105, 106 and 107 to provide a predicted error Y having the band of the current phase limited. Such a calculated band-limited predicted error Y of the current phase is applied to coefficient circuit 9 shown in FIG. 4 as an output of digital filter 8.

The present invention is not limited to the above-described embodiment where a 2-dimension FIR filter circuit is shown as a digital filter circuit of FIG. 5. The present invention can be implemented using a FIR filter circuit of an appropriate dimension.

Figure 6:
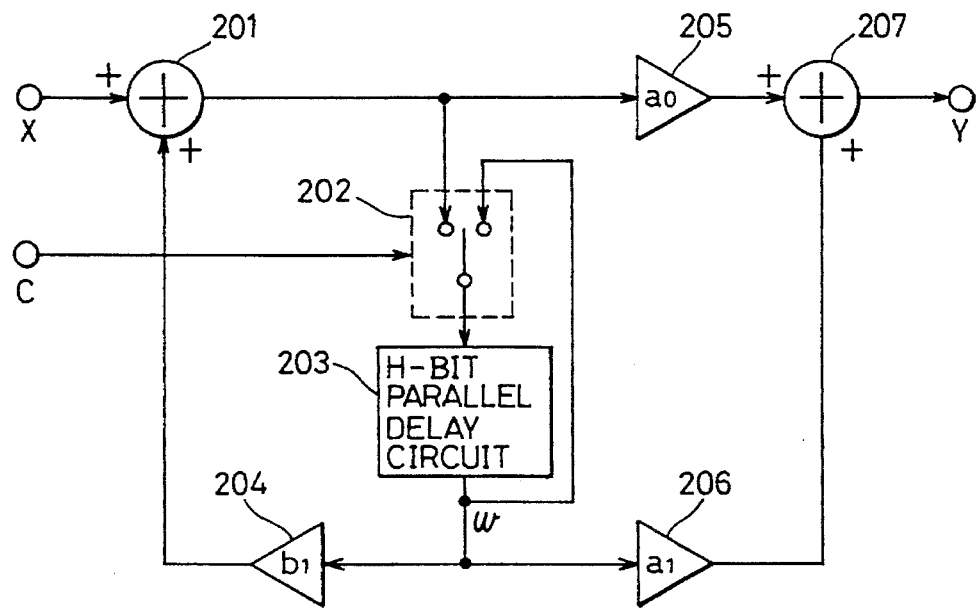
FIG. 6 is a block diagram specifically showing another digital filter circuit according to an embodiment of the present invention.

FIG. 6 is a block diagram specifically showing another example of digital filter circuit 8 of FIG. 4.

The digital filter circuit 8 shown in FIG. 6 is termed an infinite impulse response digital filter (referred to as IIR filter hereinafter) circuit. The z transfer function H(z) is represented by the following equation (13).

$$H(z) = \left( \sum_{i=0}^{\alpha} a_i z^{-i} \right) / \left( 1 + \sum_{i=1}^{\alpha} b_i z^{-i} \right) \quad (13)$$

where $a_i$ and $b_i$ are filter coefficients, and $\alpha$ represents the dimension of the IIR filter circuit. In this digital filter circuit, $z^{-1}$ represents the delay of a time period corresponding to the zero crossing point interval.

The specific example of the digital filter circuit shown in FIG. 6 is a 1-dimension IIR filter circuit. The z transfer function H(z) is represented by the following equation (14).

$$H(z) = (a_0 + a_1 z^{-1})/(1 + b_1 z^{-1}) \quad (14)$$

Referring to FIG. 6, a predicted error X of the current phase provided from subtraction circuit 7 of FIG. 4 to the IIR filter circuit is applied to one input of adder circuit 201. The output of a coefficient circuit 204 which will be described afterwards is applied to the other input of adder circuit 201. Adder circuit 201 adds the predicted error X of the current phase and the output of coefficient circuit 204. The result is applied to one input of a selection circuit 204 and the input of a coefficient circuit 205.

The output of a H-bit parallel delay circuit 203 representing a state variable w is applied to the other input of selection circuit 202. A zero crossing point signal C is applied to the control input of selection circuit 202. Selection circuit 202 selects the output of adder circuit 201 when the zero crossing point signal C is "1", otherwise selects the state variable w. The output of selection circuit 202 is applied to H-bit parallel delay circuit 203.

H-bit parallel delay circuit 203 has a delay corresponding to the sampling period, and provides a state variable w. State variable w is held by selection circuit 202 and H-bit parallel delay circuit 203, which is updated when the zero crossing point signal C is "1". More specifically, state variable w is updated when there is a zero crossing point between the current sampling point $R_{i+1}$ and the preceding sampling point Ri. The output of H-bit parallel delay circuit 203 representing a state variable w is applied to the other input of selection circuit 202, and also to coefficient circuits 204 and 206.

Coefficient circuits 204 and 206 multiply the state variable w by filter coefficients $b_1$ and $a_1$, respectively, and output the results. A coefficient circuit 205 multiplies the output of adder circuit 201 by a filter coefficient $a_0$. The outputs of coefficient circuits 205 and 206 are provided to the two inputs of an adder circuit 207.

Adder circuit 207 adds the outputs of coefficient circuits 205 and 206 to provide a band-limited predicted error Y of the current phase. Y is applied to coefficient circuit 9 shown in FIG. 4 as an output of digital filter circuit 8.

The present invention is not limited to a 1-dimension IIR filter circuit as the digital filter circuit of FIG. 6. The present invention can be enabled using an IIR filter circuit of an appropriate dimension.

In a general digital filter circuit, $z^{-1}$ of a z transfer function represents a time delay of a constant interval, for example the time delay corresponding to a sampling period. However, in the digital filter circuits of FIGS. 5 and 6, $z^{-1}$ of the z transfer function H(z) represents the delay of a time period corresponding to the zero crossing point interval. Therefore, the digital filter circuits of FIGS. 5 and 6 have a structure different from that of a general digital filter circuit. In other words, they have a particular structure including selection circuits 101, 103 and 202.

The present invention can be realized by the above-described method, which is summarized as follows.

First, determination is made whether there is a zero crossing point immediately preceding the current sampling point $R_{i+1}$. In other words, determination is made whether a zero crossing point is present between the current sampling point $R_{i+1}$ and the preceding sampling point $R_i$.

(a-1)
When there is a zero crossing point, the phase interval between the zero crossing point and the current sampling point $R_{i+1}$, i.e. the current instantaneous phase P, is obtained by the following equation (15) using the current sampling data $S_{i+1}$ and the preceding sampling data $S_i$.

$$P = |S_{i+1}|/(|S_{i+1}|+|S_i|) \times (N/2) \quad (15)$$

(a-2)
Next, determination is made whether there is a zero crossing point right before the preceding sampling point $R_i$, i.e. between preceding sampling point $R_i$ and the second preceding sampling point $R_{i-1}$.

(a-2-1)
When there is a zero crossing point, a predicted value $Pd_{i+1}$ of the phase interval between the current sampling point $R_{i+1}$ and the preceding sampling point $R_i$ is obtained by the following equation (16) using the preceding phase $P_i$ and the phase $P_{i-j}$ of a sampling point located at least two points before the current sampling point.

$$Pd_{i+1} = \{(P_i - P_{i-j} - ((N/2 \times j) \bmod N)) \times L + N/2\} \bmod N \quad (16)$$

where L is a constant (0<L<1).

(a-2-2)
When there is no zero crossing point, the predicted value $Pd_{i+1}$ of the phase interval between the current sampling point $R_{i+1}$ and the preceding sampling point $R_i$ is set equal to the predicted value $Pd_i$ of the phase interval between the preceding sampling point $R_i$ and the second preceding sampling point $R_{i-1}$, as shown by the following equation (17).

$$Pd_{i+1} = Pd_i \quad (17)$$

(a-3)

A predicted value $P_{i+1}'$ of the current phase is obtained by the following equation (18) using the above-obtained predicted value $Pd_{i+1}$ of the phase internal and the preceding phase $P_i$.

$$P_{i+1}'=(P_i+Pd_{i+1}) \bmod N \qquad (18)$$

(a-4)

A predicted error X of the current phase is obtained by the following equation (19) according to the obtained predicted value $Pd_{i+1}'$ of the current phase and the aforementioned current instantaneous phase P.

$$X=(P-P_{i+1}') \bmod N \qquad (19)$$

(a-5)

By the digital filter, the predicted error X of the current phase is converted into a band-limited predicted error Y of the current phase. With H(z) as the z transfer function of the digital filter, the band-limited predicted error Y of the current phase can be obtained by the following equation (20).

$$Y(z)=H(z)\,X(z) \qquad (20)$$

where X(z) and Z(z) represent the z conversion of the predicted error X of the current phase and the band-limited predicted error Y of the current phase, respectively, and $z^{-1}$ represents the delay of a time period corresponding to the zero crossing point interval.

(a-6)

The current phase $Pd_{i+1}$ is obtained by the following equation (21) using the band-limited predicted error Y of the current phase obtained by equation (20) and the above-described predicted value $P_{i+1}'$ of the current phase.

$$P_{i+1}=\{Y\times K+P_{i+1}'\}\bmod N \qquad (21)$$

where K is a constant (0<K<1).

(b)

When there is not a zero crossing point right before the current sampling point $R_{i+1}$, the predicted value $P_{i+1}'$ of the current phase becomes the current phase $P_{i+1}$ according to the following equation (22).

$$P_{i+1}=P_{i+1}' \qquad (22)$$

Thus, a data detection clock signal and digital data are detected according to the obtained current instantaneous phase P, the current phase $P_{i+1}$, the preceding phase $P_i$, and the conditions of clock signal extraction and data determination. The clock signal extraction conditions and data determination condition are shown in the following equations (23)–(25), and equation (26) similar to those in U.S. patent application Ser. No. 07/986,490.

$$P_i>P_{i+1} \text{ and } P_i\geq N/2 \text{ and } P_{i+1}\geq N/2 \qquad (23)$$

$$P_i>P_{i+1} \text{ and } P_i<N/2 \text{ and } P_{i+1}<N/2 \qquad (24)$$

$$P_i<P_{i+1} \text{ and } P_i<N/2 \text{ and } P_{i+1}\geq N/2 \qquad (25)$$

$$P>P_{i+1}-N/2 \qquad (26)$$

When the phase interval P between the zero crossing point and the current sampling point $R_{i+1}$, the current phase $P_{i+1}$, and the preceding phase Pi satisfy at least one of the clock signal extraction conditions shown in equations (23)–(25), determination is made that a clock signal is present. When equation (26) is met, the value of the digital data is an opposite of the MSB of the sampling data $S_i$, otherwise the MSB of $S_i$.

Regarding the digital data detectors disclosed in the related U.S. patent application Ser. No. 07/986,490 and the present invention, actual measurements of an error ratio (SER) per 1 symbol of digital data (the 8 bits before modulation, or the 10 bits after modulation, i.e. on a magnetic tape) detected from a magnetic tape recording/reproducing apparatus is shown in FIG. 7. We employed a 8–10 modulation used in a DAT (Digital Audio Tape-recorder). The wow and flutter was approximately 1.2%. The above-described coefficients of K and L were set to K=½ and L=⅛ in both the apparatuses of the related application and the present invention. The received digital data was sampled at two times a sampling bit rate (m=2). The FIR filter circuit shown in FIG. 5 was used as digital filter circuit 8 of FIG. 4 in the present embodiment, wherein the filter coefficients $A_0$, $A_1$ and $A_2$ were 8/13, 4/13, and 1/13, respectively.

In order to guarantee reliability of the reproduction operation of a magnetic tape recording/reproducing apparatus, a maximum of SER=$10^{-3}$ is necessary. To meet this condition, a SNR of approximately 28.5 dB is required in the apparatus of U.S. patent application Ser. No. 07/986,490, as appreciated from FIG. 7. In contrast, a SNR of approximately 26 dB is sufficient in the present invention. In other words, the present invention has improved the SNR by approximately 2.5 dB. By the system of the present invention, an error in digital data detected from a received digital signal can be reduced in comparison with that of a conventional case.

The present invention was described in which the input was a 1-channel. The present invention is applicable also in the case where the input is a multi-channel. For example, when there are h channels, received signals of each channel are sampled at timings differing from each other. Also, the number of stages of M-bit parallel delay circuit 2, I-bit parallel delay circuits 12, 19, 102, 104, 1 bit parallel delay circuit 18, I-bit j-stage parallel delay circuit 13, and H-bit parallel delay circuit 203 are to be increased in number by h times. This allows the apparatus of the present invention to be applied also to a received digital signal of a multi-channel.

According to the present invention, the instantaneous phase closely follows fluctuation due to a wow and flutter, and is impervious to fluctuation of noise. If the SNRs of received digital signals are the same, the digital data detector of the present application can detect digital data with a data error rate lower than that of the apparatus disclosed in the related application. If the allowable data error rate is the same, the digital data detector of the present application can detect digital data from a received digital signal of a SNR lower than that of the apparatus disclosed in the related application.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital data detector comprising:
   a sampler for sampling a received digital signal at a constant frequency higher than a channel bit rate;
   a phase interval calculator connected to receive an output of said sampler, for calculating a phase interval from a point where said received digital signal crosses a reference level to a current sampling point from the sampler;
   a reference level crossing detector, connected to receive an output of the sampler, for outputting a cross detection signal when the received digital signal between the current sampling point and a previous sampling point located one point before the current sampling point crosses the reference level;

a phase predictor for calculating a predicted phase of the current sampling point based on a phase of the prior sampling point, a phase of a sampling point located at least two points before the current sampling point, and the cross detection signal;

an error calculator for calculating a predicted error between the calculated phase interval and the predicted current phase, a band limiter for limiting a frequency band of said predicted error in response to said cross detection signal, a phase calculator for calculating a phase of the current sampling point according to said band limited predicted error, said predicted current phase, and said cross detection signal, a clock detector for detecting a data detection clock signal in synchronization with received digital signal according to a phase of each sampling point calculated by said phase calculator, and a data detector for detecting digital data from said received digital signal according to the calculated phase interval, the calculated current phase and the sampling data, the calculated current phase and the sampling data.

2. The digital data detector according to claim 1, wherein said band limiter comprises a digital filter circuit.

3. The digital data detector according to claim 2, wherein said digital filter circuit comprises a FIR filter circuit.

4. A digital data detector comprising:

a sampler for sampling a received digital signal at a constant frequency higher than a channel bit rate;

a phase interval calculator connected to receive an output of said sampler, for calculating a phase interval from a point where said received digital signal crosses a reference level to a current sampling point from the sampler;

a reference level crossing detector, connected to receive an output of the sampler, for outputting a cross detection signal when the received digital signal between the current sampling point and a previous sampling point located one point before the current sampling point crosses the reference level;

a phase predictor for calculating a predicted phase of the current sampling point based on a phase of the prior sampling point, a phase of a sampling point located at least two points before the current sampling point, and the cross detection signal;

an error calculator for calculating a predicted error between the calculated phase interval and the predicted current phase, a band limiter comprising a digital FIR filter for limiting a frequency band of said predicted error in response to said cross detection signal, a phase calculator for calculating a phase of the current sampling point according to said band limited predicted error, said predicted current phase, and said cross detection signal, a clock detector for detecting a data detection clock signal in synchronization with received digital signal according to a phase of each sampling point calculated by said phase calculator, and a data detector for detecting digital data from said received digital signal according to the calculated phase interval, the calculated current phase and the sampling data, the calculated current phase and the sampling data, wherein said FIR filter circuit comprises a plurality of stages of delay connected in series, each delaying and outputting an input signal by a time period equal to the interval between the points where said received digital signal crosses said reference level according to said cross detection signal, a plurality of multipliers having inputs respectively connected to outputs of said plurality of stages of delay, for multiplying an input signal by respective predetermined coefficients, and an adder for adding outputs of said plurality of multipliers and outputting said band limited predicted error, wherein each of said plurality of stages of delay comprises a selector having two inputs, responsive to said cross detection signal for selectively providing a signal of said two inputs, and a delay circuit having an input connected to the output of said selector, for delaying and outputting an output of said selector by a time period equal to a sampling period of said sampler, wherein one of said two inputs of said selector of said delay of a first stage receives said predicted error signal, wherein one of said two inputs of said selector of each of other said plurality of stages of delay receives an output of said delay circuit of a preceding stage, and wherein the other of said two inputs of said selector of said plurality of stages of delay receives an output of said delay circuit of the same said delay.

5. The digital data detector according to claim 4, wherein said FIR filter circuit is a two dimension filter circuit.

6. A digital data detector comprising:

a sampler for sampling a received digital signal at a constant frequency higher than a channel bit rate;

a phase interval calculator connected to receive an output of said sampler, for calculating a phase interval from a point where said received digital signal crosses a reference level to a current sampling point from the sampler;

a reference level crossing detector, connected to receive an output of the sampler, for outputting a cross detection signal when the received digital signal between the current sampling point and a previous sampling point located one point before the current sampling point crosses the reference level;

a phase predictor for calculating a predicted phase of the current sampling point based on a phase of the prior sampling point, a phase of a sampling point located at least two points before the current sampling point, and the cross detection signal;

an error calculator for calculating a predicted error between the calculated phase interval and the predicted current phase, a band limiter comprising a digital IIR filter for limiting a frequency band of said predicted error in response to said cross detection signal, a phase calculator for calculating a phase of the current sampling point according to said band limited predicted error, said predicted current phase, and said cross detection signal, a clock detector for detecting a data detection clock signal in synchronization with received digital signal according to a phase of each sampling point calculated by said phase calculator, and a data detector for detecting digital data from said received digital signal according to the calculated phase interval, the calculated current phase and the sampling data, the calculated current phase and the sampling data.

7. The digital data detector according to claim 6, wherein said IIR filter circuit comprises a plurality of stages of delay connected in series, each delaying and outputting an input signal by a time period equal to the interval between points where said received digital signal crosses said reference level according to said cross detection signal, a plurality of first multiplication means having inputs respectively connected to outputs of said plurality of stages of delay means for multiplying an input signal by respective predetermined coefficients, a plurality of second multiplication means having inputs respectively connected to outputs of said plurality of stages of delay means for multiplying an input signal by respective predetermined coefficients, first adder means for adding said predicted error and outputs of said plurality of first multiplication means, third multiplier means for multiplying an output of said first adder means by a predetermined coefficient, and second adder means for adding an output of said third multiplication means and an output of said plurality of second multiplication means for providing said band-limited predicted error, wherein each of said plurality of stages of delay means comprises selection means having two inputs, responsive to said cross detection signal for selectively providing a signal of said two inputs, a delay circuit having an input connected to an output of said selection means, for delaying and outputting an output of said selection means by a time period equal to said sampling period, wherein one of said two inputs of said selection stage of said delay means of a first stage receives an output of said first adder means, wherein one of said two inputs of said selection means of each of other said plurality of stages of delay means receive an output of said delay circuit of a preceding stage, and the other of said two inputs of said selection means of said plurality of delay means receives an output of said delay circuit of the same said delay means.

8. The digital data detector according to claim 7, wherein said IIR filter circuit is a 1-dimension filter circuit.

9. A method for detecting digital data comprising the steps of:

sampling a received digital signal at a frequency higher than a channel bit rate;

calculating a phase interval from a point where the received digital signal crosses a reference level to a current sampling point;

generating a cross detection signal when the received digital signal between the current sampling point and a previous sampling point located one point before the current sampling point crosses the reference level;

calculating a predicted phase of the current sampling point based on a phase of the prior sampling point, a phase of a sampling point located at least two points before the current sampling point, and the cross detection signal;

calculating a predicted error between the calculated phase interval and the predicted current phase;

limiting the frequency of the predicted error in response to the cross detection signal;

calculating a phase of the current sampling point according to the band limited predicted error, the predicted current phase, and the cross detection signal; and detecting digital data from the received digital signal according to the calculated phase interval, the calculated phase of the current sampling point, and the sampling data.

10. A method for detecting digital data, comprising the steps of;

sampling a received digital signal at a frequency higher than a channel bit rate;

determining a phase value for a current sampling point and a predicted phase of the current sampling point;

calculating a predicted error between the determined phase value and the determined predicted phase value for the current sampling point;

limiting a frequency band of the predicted error;

calculating a phase of the current sampling point using the frequency limited predicted error; and detecting digital data from the received digital signal using the calculated phase of the current sampling point, the determined phase value, and the sampled data.

11. The method according to claim 9, wherein the limiting step is performed using an infinite impulse response (IIR) digital filter.

12. The method according to claim 10, wherein the limiting step is performed using an infinite impulse response (IIR) digital filter.

* * * * *